United States Patent [19]

Sheldon

[11] Patent Number: 4,763,022
[45] Date of Patent: Aug. 9, 1988

[54] TTL-TO-CMOS BUFFER
[75] Inventor: Peter E. Sheldon, Mesa, Ariz.
[73] Assignee: GTE Communication Systems Corporation, Phoenix, Ariz.
[21] Appl. No.: 354
[22] Filed: Jan. 5, 1987
[51] Int. Cl.[4] .................. H03K 5/01; H03K 17/687
[52] U.S. Cl. ................................. 307/475; 307/264
[58] Field of Search .............. 307/264, 475, 558, 551, 307/296.8; 328/168

[56] References Cited
U.S. PATENT DOCUMENTS

| | | | |
|---|---|---|---|
| 4,000,411 | 12/1976 | Sano et al. | 307/475 |
| 4,080,539 | 3/1978 | Stewart | 307/264 |
| 4,424,456 | 1/1984 | Shiraki et al. | 307/268 |
| 4,486,670 | 12/1984 | Chan et al. | 307/264 |

Primary Examiner—Stanley D. Miller
Assistant Examiner—Richard Roseen
Attorney, Agent, or Firm—John A. Odozynski

[57] ABSTRACT

A TTL-to-CMOS converter consists of a plurality of N-channel and P-channel MOS transistors, each of which is fabricated so as to have a predetermined channel Width-to-Length ratio (W/L). The transistors are arranged to include an input complementary pair for accepting TTL-level signals and an output complementary pair for providing CMOS-level signals. An N-channel tracking transistor is coupled between the drain electrodes of the P-channel and N-channel transistors of the input complementary pair. The (W/L) of the tracking transistor is approximately $\frac{1}{8}$ to to 1/7 times the (W/L) of the N-channel transistor of the input complementary pair. This arrangement establishes a converter switch point with a significantly greater degree of accuracy than otherwise attainable. A pull-up transistor has a gate electrode coupled to the input terminal of the input complementary pair and a drain electrode coupled to the input electrode of the output complementary pair. The pull-up transistor operates to pull the input terminal of the output complementary pair toward Vdd as the TTL logic level at the input of the Buffer goes low.

27 Claims, 1 Drawing Sheet

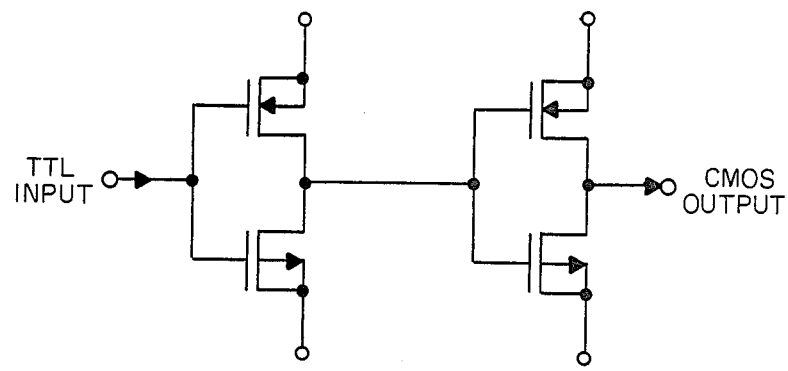
FIG. I (PRIOR ART)
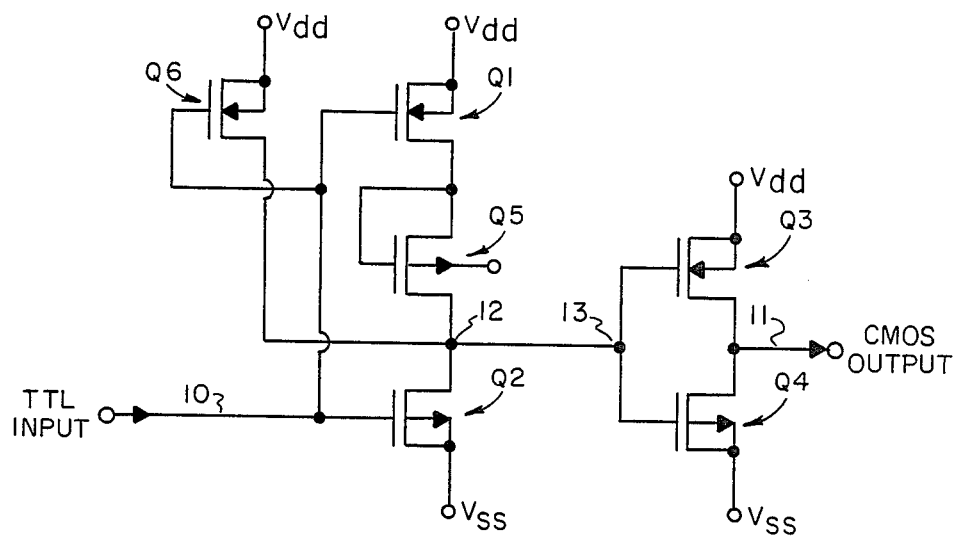
FIG. 2

TTL-TO-CMOS BUFFER

FIELD OF THE INVENTION

This invention relates to integrated circuit design techniques and, more particularly, to an improved circuit configuration for converting signals provided at TTL-logic levels to signals at CMOS-logic levels.

BACKGROUND OF THE INVENTION

In implementing electronic systems or circuits comprising various logic types, it is often necessary to effect logic-level conversions at the interface between circuits of different logic types. A typical TTL-to-CMOS converter (or, alternatively, TTL-to-CMOS Buffer) is shown in FIG. 1. That circuit is used to convert standard TTL output levels (VOL=0.0 to 0.8 volt; VOH=2.0 volts to Vcc) to standard CMOS input levels (VIL=less than 0.3 volt; VIH=greater than (Vdd−0.3 volts)). The switch point for a circuit such as the one set forth in FIG. 1 can be anywhere in the range between 0.8 and 2.0 volts. (For present purposes "switch point" may be understood as the voltage that, when applied at the input, will cause the voltage at the output of the converter to change logic states.) Ideally the voltage will be equal to approximately Vdd/2, where Vdd is the converter supply voltage.

One drawback exhibited by heretofore known logic level converters is the tendency to respond, that is, exhibit a change in output logic state, to spurious or extraneous signals. For example, it has been found that a substantial transient current drain, even though associated with circuitry remote from the converter, can produce momentary changes in the voltage levels of Vdd or Vss. These changes may appear in the vicinity of, or be conducted to, the input circuitry of the logic converter circuit. The converter may then erroneously sense an apparent change in the input voltage. A response by the logic converter to the apparent input transition will cause unintended and invalid data to be propagated through the system.

Therefore, what is desired is a newly configured logic converter, specifically a TTL-to-CMOS Buffer, that exhibits a narrow range of input voltages to which the converter will respond with a change in output logic state. Ideally, the switch point will be midway between VIL, max and VIH, min, or midway between 0.8 and 2.0 volts (=1.4 volts). In addition, the switch point should exhibit substantial stability in the face of variations in operating parameters such as supply voltage, ambient temperature, and so forth.

DISCLOSURE OF THE INVENTION

The above and other objects, advantages and capabilities are achieved in a TTL-to-CMOS Buffer that consists of a plurality of N-channel and P-channel MOS transistors, each of which is fabricated so as to have a predetermined channel Width-to-Length ratio (W/L). The transistors are arranged to include an input complementary pair for accepting TTL-level signals and an output complementary pair for providing CMOS-level signals. An N-channel tracking transistor is coupled between the drain electrodes of the P-channel and N-channel transistors of the input complementary pair. The (W/L) of the tracking transistor is approximately 1/8 to 1/7 times the (W/L) of the N-channel transistor of the input complementary pair. This arrangement establishes a converter switch point with a significantly greater degree of accuracy than otherwise attainable. A pull-up transistor has a gate electrode coupled to the input terminal of the input complementary pair and a drain electrode coupled to the input electrode of the output complementary pair. The pull-up transistor operates to pull the input terminal of the output complementary pair toward Vdd as the TTL logic level at the input of the Buffer goes low.

BRIEF DESCRIPTION OF THE DRAWINGS

FIG. 1 is a circuit diagram of a typically configured TTL-to-CMOS Buffer.

FIG. 2 is a circuit diagram of the subject TTL-to-CMOS Buffer.

DESCRIPTION OF A PREFERRED EMBODIMENT OF THE INVENTION

For a better understanding of the subject invention, refer to the following description and appended claims, in conjunction with the above-described drawings.

Referring now to FIG. 2, the subject TTL-to-CMOS Buffer is seen to include an input complementary pair of MOS transistors, including a P-channel (PMOS) transistor, Q1, and an N-channel (NMOS) transistor, Q2. The gate electrodes of Q1 and Q2 are connected in common for coupling to a source of TTL-level logic signals that may be applied to an input terminal 10. The Buffer also includes an output complementary pair including a PMOS transistor, Q3, and an NMOS transistor, Q4. The input of the output complementary pair, at the gate electrodes of Q3 and Q4, is connected in common to the output of the input complementary pair, at the drain electrode of Q2. The drain electrodes of Q3 and Q4 are connected in common for providing CMOS-level logic signals at an output terminal 11.

A tracking NMOS transistor has its gate and source electrodes coupled to the drain electrode of Q1 and its drain electrode coupled to the drain electrode of Q2. Q2, together with Q5, serves to enhance the immunity of the Buffer switching point to process variations and temperature changes.

A pull-up PMOS transistor, Q6, has a gate electrode connected to the gate electrodes of Q1 and Q2 and a drain electrode coupled to the gate electrodes of Q3 and Q4. Q6 operates to pull-up the voltage at the gate electrodes of Q3 and Q4.

As shown in FIG. 2, the source electrodes of Q1, Q3 and Q6 are coupled to a first reference potential, that is, Vdd, while the source electrodes of Q2 and Q4 are coupled to a second reference potential, that is, Vss.

As is well known to practitioners in the art of CMOS circuit design, the channel Width-to-Length ratio, (W/L), of the individual transistors used in a circuit can be important in determining the operation of the circuit. For the subject TTL-to-CMOS Buffer, the approximate values of the ratios are:

Q1:50
Q2:29
Q3:11
Q4:6
Q5:4
Q6:1.4.

It is, however, understood that these values may be subject to some modification by practitioners skilled in the art.

Among the salient advantages and aspects of the circuit illustrated in FIG. 2 and described above is the imposition of a more narrow boundary on the Buffer switch point. For example, the switch point exhibited by standard circuitry (FIG. 1), lies within a range extending from 0.8 to 2.0 volts. The range imposed by the subject Buffer is narrowed to 1.0 to 1.8 volts. As a result, a change in either Vdd or Vss up to 200 mV will not influence circuit operation and, therefore, will not cause spurious data to propagate through the system. In addition, the subject Buffer assures an average switch point at approximately 1.4 volts, at the nominal midpoint of the range, as the Buffer operating parameters, (supply voltage, ambient temperature, K'n, K'p, Vtn and Vtp) are varied throughout their expected operating ranges.

Because the characteristics of Q2 and Q5 dominate the determination of the Buffer switch point, the ratio of their sizing, that is, their respective (W/L)s, is key to the operation of the Buffer and, particularly, to the stability of the Buffer switch point. With this in mind, it has been found that the (W/L) of tracking transistor Q5 is preferred to be ⅛ to 1/7 times the (W/L) of transistor Q2. Because, for these purposes, operative ratioing is effected between two transistors of the same conductivity type, Q2 and Q5, enhanced tracking and greater switch point stability will result in the face of temperature shifts and process variations. This enhancement is not available when ratioing is effected between transistors of opposite conductivity types. The subject Buffer in this respect provides a substantial advantage over the Buffer depicted in FIG. 1.

In addition, transistor Q6 provides a further performance enhancement by pulling the voltage at the gates of the output complementary pair more nearly to Vdd as the voltage at the input of the Buffer goes low. Absent Q6, the voltage at the gates of Q3 and Q4 would be pulled up by Q5 only to a voltage somewhat less than Vdd. As a result Q3 and Q4 would remain somewhat conductive. The (W/L) of Q6 is minimized in order to reduce its effect on the Buffer switch point.

Q1 prevents the occurrence of a low-resistance (high-current) path between Vdd and Vss when the voltage at the input 10 becomes high (very nearly equal to Vdd). When the voltage at the input of the Buffer approaches Vdd, Q1 is rendered nonconductive, thereby preserving the typically low-current characteristics of the CMOS device. Because the (W/L) of Q1 is relatively high, it has very little effect on the Buffer switch point.

To reiterate, the subject TTL-to-CMOS Buffer provides enhanced accuracy of its switch point, primarily through the inclusion of an additional transistor, Q5, that is included to provide enhanced tracking with the NMOS transistor of the input complementary pair. As a result, the range within which the Buffer switch point might occur has been limited to 1.0 to 1.8 volts. Consequently, transient voltages on the order of 200 mV will not cause spurious data to propagate through the Buffer. Beyond the advantage of additional immunity to supply voltage transients, the disclosed circuit configuration offers enhanced switch point stability in the face of process and temperature variations. Although the additional devices included in this configuration require increased semiconductor surface area, this effect is expected to be minimized by forthcoming process improvements. The subject Buffer has been found to interpose propagation delays no greater or less than the propagation delays resulting from heretofore known circuitry.

The above and other objects and advantages are achieved in a TTL-to-CMOS Buffer, or, as it may be alternatively designated, level converter, as specifically set forth above. However, various changes and modifications may be made therein without departure from the scope of the invention as defined by the appended claims.

What is claimed is:

1. A TTL-to-CMOS Buffer consisting of a plurality N-channel and a plurality of P-channel MOS transistors, wherein each of the transistors is characterized by a predetermined channel Width-To-Length ratio (W/L) and wherein the transistors are configured to include:
   an input complementary pair, Q1 and Q2, in which gate electrodes of Q1 and Q2 are connected in common for coupling to a source of TTL-level logic signals;
   an output complementary pair, Q3 and Q4, in which gate electrodes of Q3 and Q4 are connected in common to a drain electrode of Q2 and in which drain electrodes of Q3 and Q4 are connected in common for providing CMOS-level logic signals; and
   a tracking transistor, Q5, connected between the drain electrode of Q1 and the drain electrode of Q2 so as to provide enhanced immunity of the TTl-to-CMOS Buffer switching point to process variations and temperatures changes.

2. A TTL-to-CMOS Buffer as defined in claim 1 wherein the (W/L) of Q2 is approximately between seven and eight times greater than the (W/L) of Q5.

3. A TTL-to-CMOS Buffer as defined in claim 2 wherein the (W/L) of Q2 is equal to approximately 29 and the (W/L) of Q5 is equal to approximately 4.

4. A TTL-to-CMOS Buffer as defined in claim 3 further comprising a pull-up transistor, Q6, having a gate electrode connected to the gate electrodes of Q1 and Q2 and a second electrode coupled to the gate electrodes of Q3 and Q4, said pull-up transistor for pulling the gate electrodes of Q3 and Q4 toward a reference potential, Vdd, upon the application of specified voltage levels from the source of TTL-level logic signals.

5. A TTL-to-CMOS Buffer as defined in claim 4 wherein the second electrode of Q6 is a drain electrode.

6. A TTL-to-CMOS Buffer as defined in claim 5 wherein Q6 operates to pull the gate electrodes of Q3 and Q4 toward Vdd when the voltage applied by the source of TTL-level logic signals goes low.

7. A TTL-to-CMOS Buffer as defined in claim 1 further comprising a pull-up transistor, Q6, having a gate electrode connected to the gate electrodes of Q1 and Q2 and a second electrode coupled to the gate electrodes of Q3 and Q4, said pull-up transistor for pulling the gate electrodes of Q3 and Q4 toward a reference potential, Vdd, upon the application of specified voltage levels from the source of TTL-level logic signals.

8. A TTL-to-CMOS Buffer as defined in claim 7 wherein the Width-to-Length ratio, (W/L), of Q2 is approximately between seven and eight times greater than the (W/L) of Q5.

9. A TTL-to-CMOS Buffer as defined in claim 8 whereon the (W/L) of Q2 is equal to approximately 29 and the (W/L) of Q5 is equal to approximately 4.

10. A logic-level converter consisting of a plurality of N-channel and a plurality of P-channel MOS transistors, wherein each of the transistors has a predetermined channel Width-to-Length ratio, (W/L), and in which the transistors are configured to include:

an input complementary pair having an input terminal (10) for coupling to a source of logic signals of a first range;

an output complementary pair having an output terminal (11) for providing logic signals of a second range and having an input terminal (13) coupled to an output terminal (12) of the input complementary pair; and a tracking transistor coupled between a P-channel and an N-channel transistor of the input complementary pair so as to stabilize the switch point of the converter with respect to process variations and temperature changes.

11. A logic-level converter as defined in claim 10 wherein the tracking transistor has its gate and source electrode coupled to a drain electrode of the transistor of the input complementary pair of a conductivity type different from the conductivity type of tracking transistor and wherein the tracking transistor has a drain electrode connected to the transistor of the input complementary pair of a conductivity type the same as the conductivity type of the tracking transistor.

12. A logic-level converter as defined in claim 11 wherein the tracking transistor is an N-channel transistor.

13. A logic-level converter as defined in claim 12 wherein the (W/L) of the tracking transistor is approximately ⅛ to 1/7 times the (W/L) of the transistor of the input complementary pair of the same conductivity type as the conductivity type of the tracking transistor.

14. A logic-level converter as defined in claim 13 wherein the (W/L) of the tracking transistor is equal to approximately 4.

15. A logic-level converter as defined in claim 11 wherein the (W/L) of the tracking transistor is approximately ⅛ to 1/7 times the (W/L) of the transistor of the input complementary pair of the same conductivity type as the conductivity type of the tracking transistor.

16. A logic-level converter as defined in claim 15 wherein the (W/L) of the tracking transistor is equal to approximately 4.

17. A logic-level converter as defined in claim 16 wherein the tracking transistor is an N-channel transistor.

18. A logic-level converter as defined in claim 10 and further comprising a pull-up transistor having a gate electrode coupled to the input terminal of the input complementary pair and a second electrode coupled to the input electrode of the output complementary pair, said pull-up transistor operative so as to pull the input terminal of the output complementary pair toward a reference potential upon the application of specified voltage levels within the first range of logic signals.

19. A logic-level converter as defined in claim 18 wherein the second electrode of the pull-up transistor is a drain electrode.

20. A logic-level converter as defined in claim 19 wherein the pull-up transistor operates to pull the input terminal of the output complementary pair toward Vdd when the voltage at the input terminal of the input complementary pair goes low.

21. A logic-level converter as defined in claim 18 wherein the tracking transistor has its gate and source electrodes coupled to the drain electrode of the transistor of the input complementary pair of a different conductivity type from the conductivity type of the tracking transistor and wherein the tracking transistor has a drain electrode connected to the transistor of the input complementary pair of a conductivity type the same as the conductivity type of the tracking transistor.

22. A logic-level converter as defined in claim 21 wherein the tracking transistor is an N-channel transistor.

23. A logic-level converter as defined in claim 22 wherein the (W/L) of the tracking transistor is approximately ⅛ to 1/7 times the (W/L) of the transistor of the input complementary pair of the same conductivity type as the conductivity type of the tracking transistor.

24. A logic-level converter as defined in claim 23 wherein the (W/L) of the tracking transistor is equal to approximately 4.

25. A logic-level converter as defined in claim 21 wherein the (W/L) of the tracking transistor is approximately ⅛ to 1/7 times the (W/L) of the transistor of the input complementary pair of the same conductivity type as the conductivity type of the tracking transistor.

26. A logic-level converter as defined in claim 25 wherein the (W/L) of the tracking transistor is equal to approximately 4.

27. A logic-level converter as defined in claim 26 wherein the tracking transistor is an N-channel transistor.

* * * * *